United States Patent
Kanji (10) Patent No.: US 7,817,807 B2
(45) Date of Patent: Oct. 19, 2010

(54) AUDIO OUTPUT DRIVER AND METHODS FOR USE THEREWITH

(75) Inventor: Ajaykumar Kanji, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 1366 days.

(21) Appl. No.: 11/286,845

(22) Filed: Nov. 22, 2005

(65) Prior Publication Data

US 2007/0116303 A1    May 24, 2007

(51) Int. Cl.
*H04B 15/00* (2006.01)
(52) U.S. Cl. .................................... 381/94.5
(58) Field of Classification Search ............... 381/94.5, 381/120, 111, 116; 330/51
See application file for complete search history.

(56) References Cited

U.S. PATENT DOCUMENTS 5,151,942 A * 9/1992 Sasaki ..................... 381/94.5

FOREIGN PATENT DOCUMENTS

WO    WO2005091497 A1 * 9/2005

* cited by examiner

*Primary Examiner*—Vivian Chin
*Assistant Examiner*—Kile Blair
(74) *Attorney, Agent, or Firm*—Gary R. Stanford (57) ABSTRACT

An audio output driver includes an audio amplifier for generating an amplified signal. A virtual ground generator generates a virtual ground signal in response to a virtual ground reference. A combiner produces an output signal, based on the amplified signal and the virtual ground signal, that is coupled to an audio output device. A voltage equalizer equalizes the virtual ground reference and the output signal when the supply voltage compares unfavorably to a supply voltage threshold.

22 Claims, 11 Drawing Sheets

AUDIO OUTPUT DRIVER AND METHODS FOR USE THEREWITH

CROSS REFERENCE TO RELATED PATENTS

None

BACKGROUND OF THE INVENTION

1. Technical Field of the Invention

The present invention relates to audio drivers as may be used in audio codecs, computers and related methods.

2. Description of Related Art

As is known, audio signals are processed by a wide variety of electronic equipment, including portable, or handheld, devices. Such devices include laptop, notebook and other personal computers, personal digital assistants (PDA), CD players, MP3 players, DVD players, AM/FM radio, cellular telephones, etc. Each of these devices includes one or more integrated circuits to provide the functionality of the device. As an example, a computer may include an audio codec integrated circuit to support the processing of audio signals in order to produce an audio output that is delivered to the user through speakers, headphones or the like.

One concern with the implementation of integrated circuits is the noise generated when a devise is turned off and turned on. Frequently, a noise transient is generated, such as a "pop", that may be disagreeable to the user or may potentially damage the audio output device The need exists for audio output circuitry that can avoid the generation of these noise transients and that can be efficiently implemented in an integrated circuit.

DETAILED DESCRIPTION OF THE INVENTION INCLUDING THE PRESENTLY PREFERRED EMBODIMENTS

Figure 1:
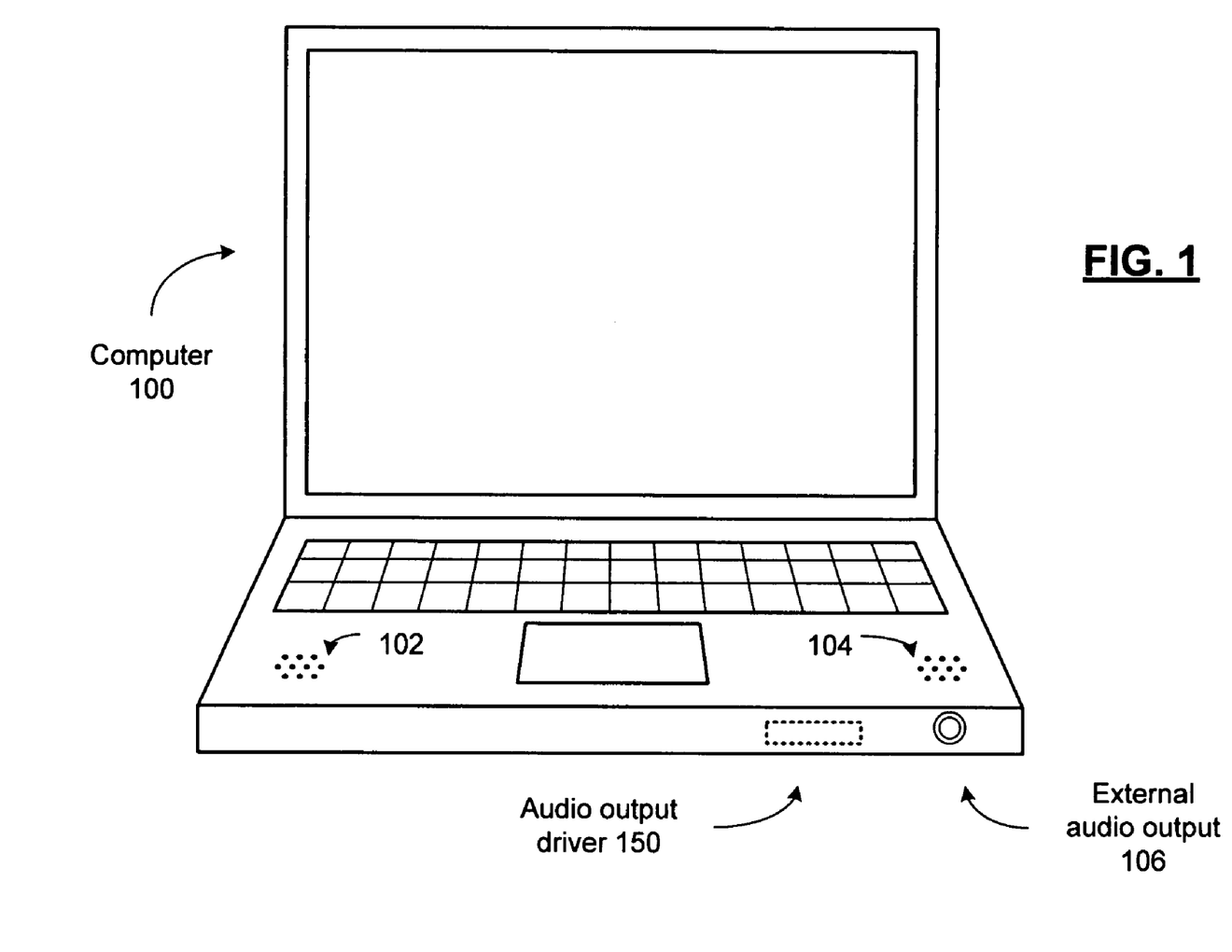
FIG. 1 presents a pictorial view of a computer in accordance with an embodiment of the present invention.

FIG. 1 presents a pictorial view of a computer in accordance with an embodiment of the present invention. In particular, computer 100 includes audio output driver 150 for producing audio signals, such as music, speech signals, audio tracks of movies or other signals, that are stored in memory, on a disk, flash drive or other removable storage medium, or from a streaming source of audio content from an audio codec or other audio processing device. Audio output driver 150 provides an output signal to integrated speakers 102 and 104. In addition, computer 100 includes an external audio output 106 such as an output jack, for coupling the output signal to external audio output devices such as speakers, stereo systems, headphones, ear buds, or the like.

Audio output driver 150 includes various features and functions in accordance with the present invention that will be described in conjunction with the figures that follow.

Figure 2:
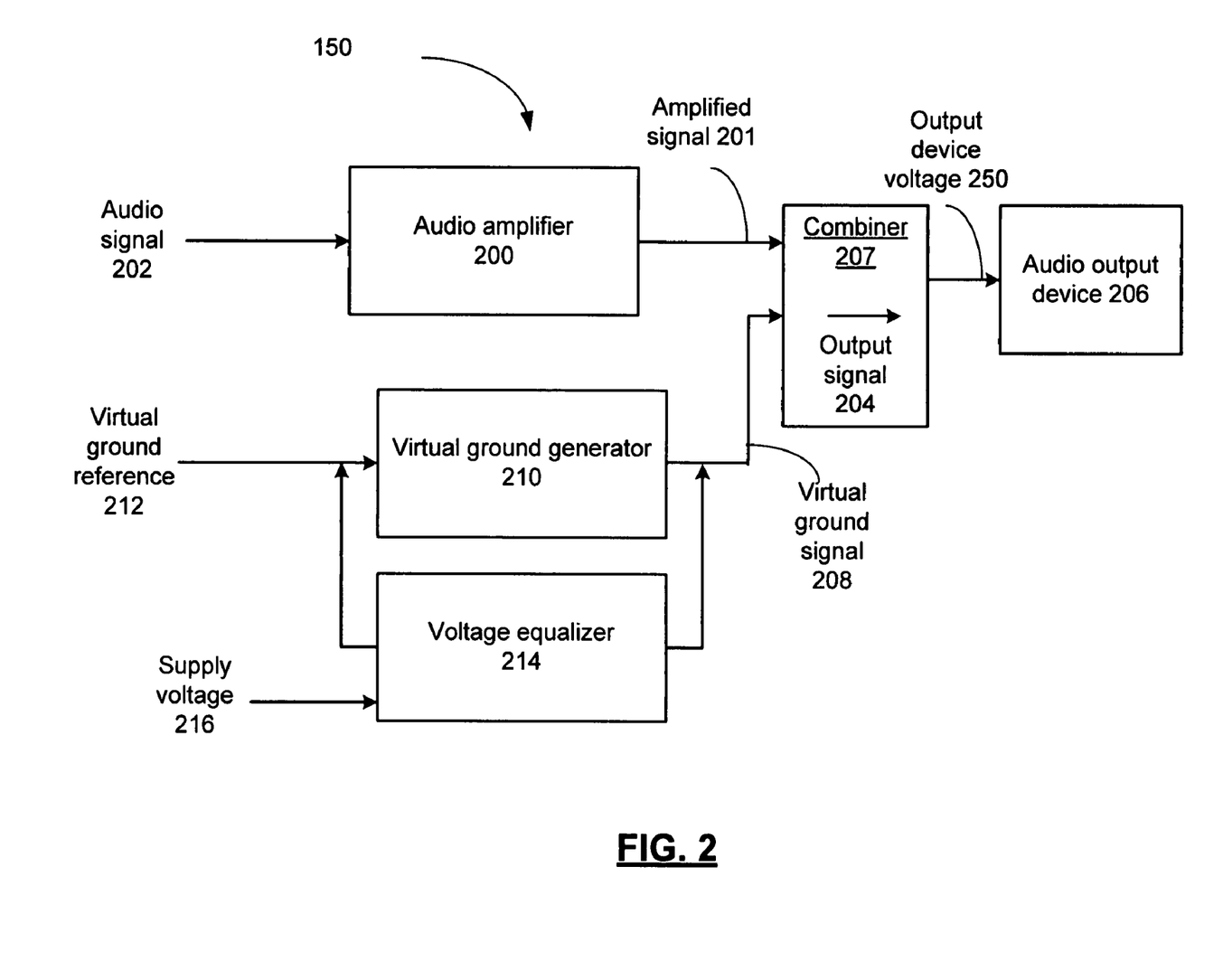
FIG. 2 presents a block diagram representation of an audio output driver 150 in accordance with an embodiment of the present invention.

FIG. 2 presents a block diagram representation of an audio output driver 150 in accordance with an embodiment of the present invention. In particular an audio output driver 150 is presented that includes an audio amplifier 200 for generating an amplified signal 201 in response to an audio signal 202. A virtual ground generator 210 generates a virtual ground signal 208 in response to a virtual ground reference 212. A combiner 207 is operably coupled to the audio amplifier 200 and the virtual ground generator 210 for producing an output signal 204, that is based on the amplified signal 201 and the virtual ground signal 208, and that is coupled to audio output device 206. A voltage equalizer 214 is operably coupled to a supply voltage 216, the virtual ground reference 212 and to the virtual ground signal 208, for equalizing the virtual ground reference 212 and the output signal 204 when the supply voltage 216 compares unfavorably to a supply voltage threshold.

In an embodiment of the present invention, audio output device 206 can include a single speaker for providing a monaural output, or a plurality of speakers for providing a multi-channel output such as a stereo output, surround sound output, 5.1 or 7.1 channel output, etc. Audio output device 206 can include stereo system inputs or speakers having their own amplification that present a high impedance such as 10 kΩ or more. Alternatively, audio output device 206 may include one or more loudspeakers, headphones or ear buds having low impedances such as 100Ω or less. In an embodiment, audio amplifier 200 can include a voltage follower, power amplifier or other amplifier, with or without voltage amplification, that is capable of supplying sufficient power to drive audio output device 206.

In accordance with an embodiment of the present invention, when power is removed from the audio output driver 150, audio amplifier 200 ceases production of amplified signal 201. For a period of time, the audio output device 206 and the output signal are driven only by virtual ground signal 208. Voltage equalizer 214 conducts current between the virtual ground signal 208 and the virtual ground reference 212 to equalize the voltage between these two signals. Virtual ground reference decays at a slow rate, such as a sub-audio rate with an effective time constant that is below the audio frequency range. This drives the audio output device 206 with an output device voltage 250 with frequencies that fall below the audio band, and therefore are inaudible. These and other advantages of the invention will be discussed further, including additional embodiments and implementations of the present invention in association with FIGS. 3-11 that follow.

Figure 3:
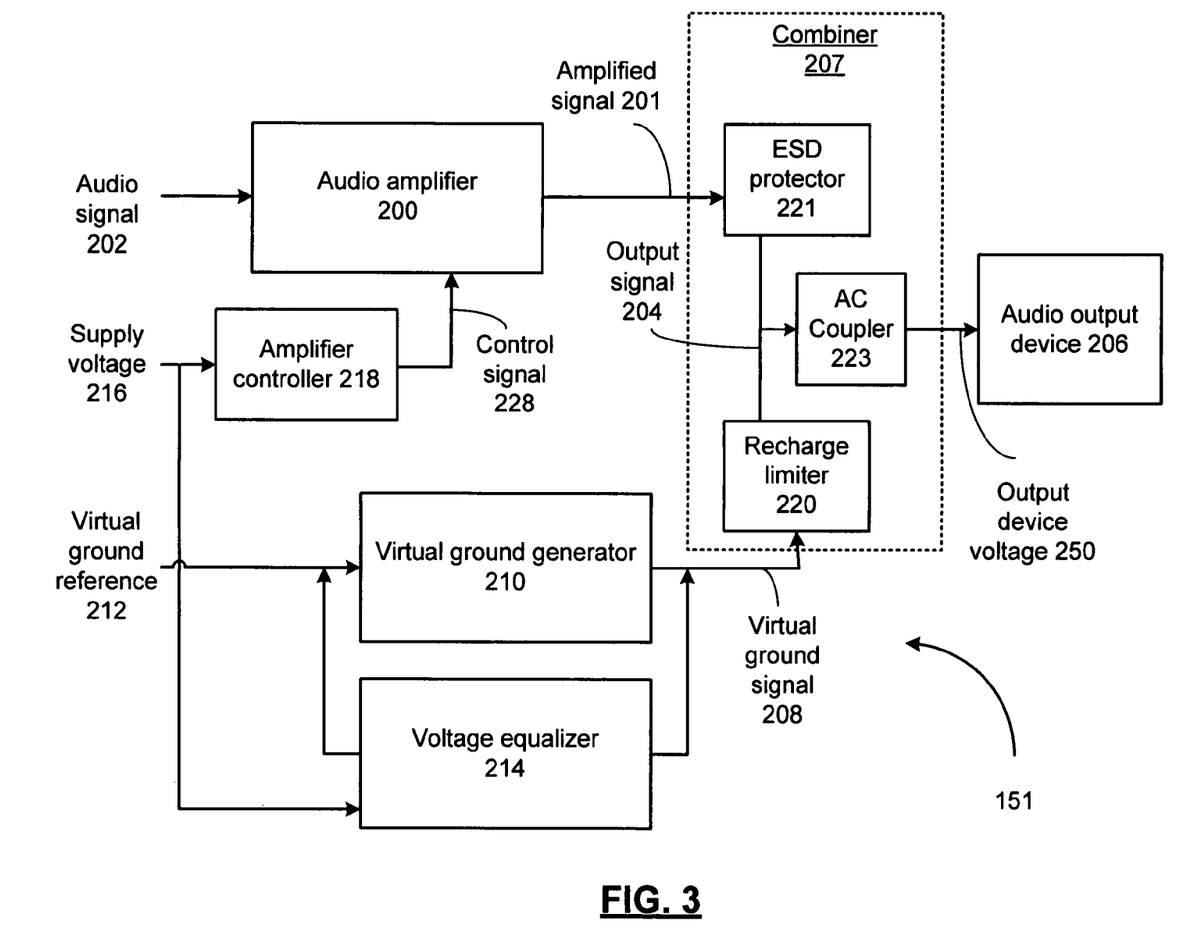
FIG. 3 presents a block diagram representation of an audio output driver 151 in accordance with an embodiment of the present invention.

FIG. 3 presents a block diagram representation of an audio output driver 151 in accordance with an embodiment of the present invention. In addition to the audio amplifier 200, audio output device 206, combiner 207, virtual ground generator 210 and voltage equalizer 214, the audio output driver 151 includes an amplifier controller 218 for monitoring the supply voltage 216 to the audio amplifier 200 and for disabling the output signal 204, based on the supply voltage. In this fashion, when the supply voltage is insufficient to power audio output device 206 without clipping, or some other form or noise or distortion, the output signal 204 is disabled.

In an embodiment of the present invention, combiner 207 includes a recharge limiter 220 for coupling the virtual ground 208 to audio output device 206 and to output signal 204. In an embodiment of the present invention, recharge limiter 220 limits a recharge rate of the output signal during a power-up procedure to a rate, such as a sub-audio rate. When the audio output driver is powered up, the output signal is initially disabled. Virtual ground reference includes a direct current (DC) offset that, as the audio output driver 151 is powered up, charges at a sub-audio rate. Recharge limiter 220 is coupled to output signal 204 and virtual ground signal 208 to charge output signal 204 at a similar sub-audio rate. This avoids the generation of transient signals in the audio band that would otherwise be reproduced as an undesirable audio signal by audio output device 206.

In addition, combiner 207 includes electrostatic discharge (ESD) protector 221 for providing ESD protection for audio amplifier 200 by limiting the current to the output and dissipating a static charge. Alternating current (AC) coupler 223 AC couples the output signal 204 to the audio output device 206. Because audio output device 206 includes a resistive impedance, output device voltage 250 is a high-pass filtered version of output signal 204.

Figure 4:
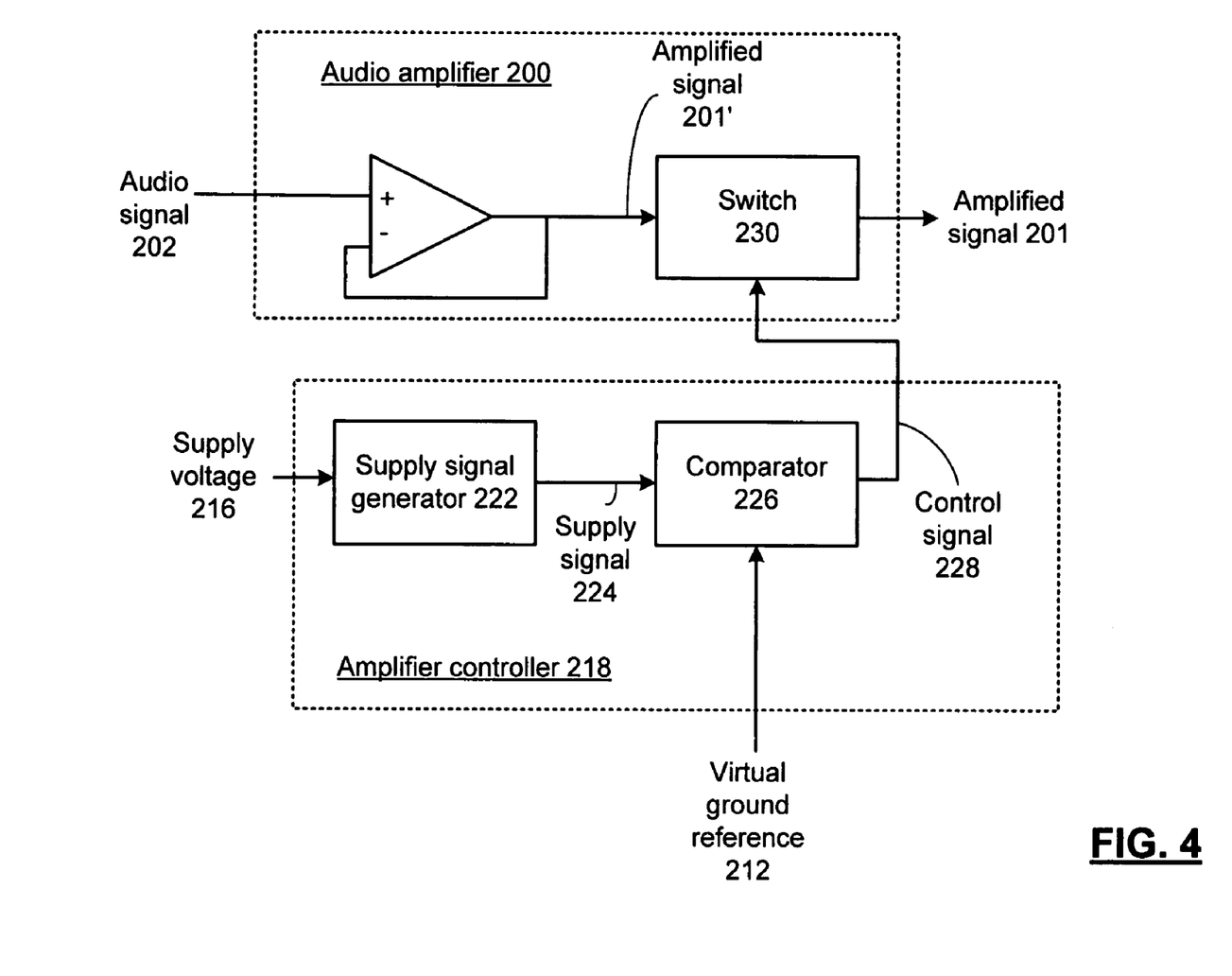
FIG. 4 presents a block diagram representation of an amplifier controller 218 in accordance with an embodiment of the present invention.

FIG. 4 presents a block diagram representation of an amplifier controller 218 in accordance with an embodiment of the present invention. In particular, one possible implementation of amplifier controller 218 is presented that includes a supply signal generator 222, operably coupled to the supply voltage 216, for generating a supply signal 224. For the purposes of this illustration, amplified signal 201, that is fed to combiner 207, is selectively connected to or disconnected from the true amplifier output, represented here as amplified signal 201'.

In an embodiment of the present invention, supply signal generator 222 includes a resistive voltage divider that provides a supply signal 224 that is proportional to the supply voltage 216. Comparator 226 compares the virtual ground reference 212 to the supply signal 224 and asserts a control signal 228 when the supply signal compares unfavorably to the virtual ground reference. In an embodiment, when the audio output driver 151 is powered down, the supply voltage 216 discharges more rapidly than the virtual ground reference 212—that discharges at a relatively slow rate. As supply signal 224 drops below the virtual ground reference 212, control signal 228 is asserted that opens switch 230 and disables amplified signal 201 by disconnecting the amplified signal from combiner 207. In this instance, audio output device 206 is supplied by virtual ground signal 208 through recharge limiter 220.

In an embodiment of the present invention, amplifier controller 218 enables the amplified signal 201, after the virtual ground reference 212 is established and when the supply signal 224 compares favorably to the virtual ground reference 212. This is to ensure that virtual ground reference 212 has stabilized prior to providing the output of audio amplifier 200 to audio output device 206. In an embodiment, amplifier controller 218 waits until virtual ground reference 212 reaches a predetermined level before enabling output signal 204. In an alternative embodiment, amplifier controller 218 waits a predetermined period of time from power-up before enabling output signal 204.

In embodiments of the present invention, comparator 226 can be implemented with or without hysteresis. Switch 230 can be implemented with a transistor, relay of integrated circuit switch. Alternatively, switch 230 can be implemented functionally by a control line to audio amplifier 200 or combiner 207 to disable or decouple the audio amplifier 200 or amplified signal 201 from audio output device 206.

Figure 5:
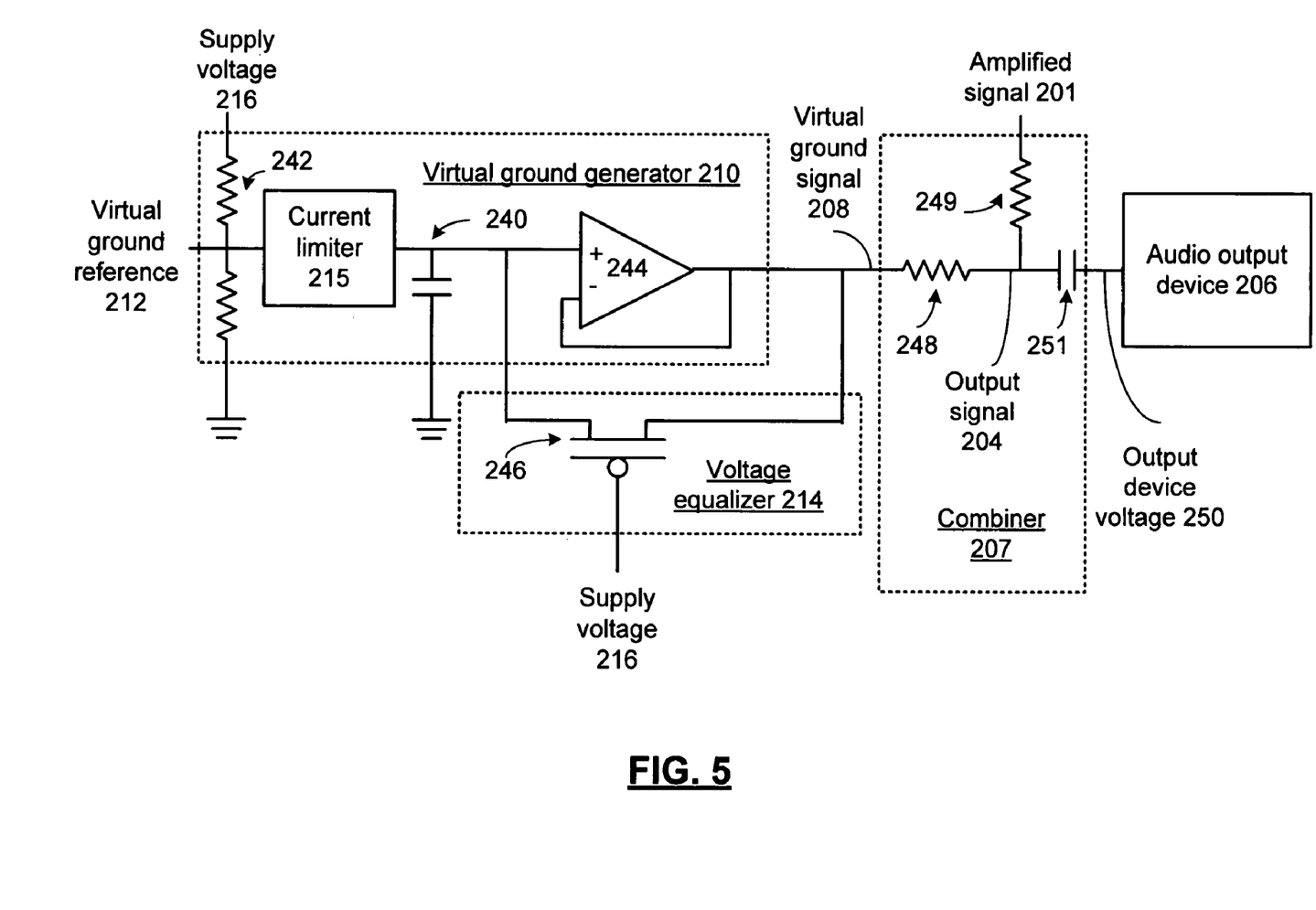
FIG. 5 presents a schematic/block diagram representation of virtual ground generator and voltage equalizer in accordance with an embodiment of the present invention.

FIG. 5 presents a schematic/block diagram representation of virtual ground generator and voltage equalizer in accordance with an embodiment of the present invention. In this embodiment of the present invention, voltage equalizer 214 is implemented with p-channel metal oxide semiconductor (PMOS) transistor 246. ESD protector 221 is implemented with a resistor such as resistor 249. Recharge limiter 220 is implemented with a resistor, such as resistor 248, and AC coupler 223 is implemented with a capacitor, such as capacitor 251.

During normal operation, amplified signal 201 provides an audio output signal that generates output signal 204 through a resistive voltage divider comprising resistors 248 and 249, that is AC coupled to audio output device 206 through capacitor 251. During a power down sequence of audio output driver 150 or 151, the supply voltage 216 compares unfavorably to a supply voltage threshold, in this case, the PMOS threshold voltage. Transistor 246 conducts a current between the virtual ground reference and the virtual ground signal 208, substantially equalizing the voltage between virtual ground reference 212 and output signal 204, through resistor 248.

In this embodiment, virtual ground generator 210 includes a resistive voltage divider 242 for providing a suitable virtual ground reference level 212 and a capacitor 240 and current limiter 215 for stabilizing the virtual ground reference 212 and slowing the rate of discharge and recharge as previously described. In an embodiment of the present invention, current limiter 215 includes a charge pump or other current source, provided however, a passive current limiter such as a resistor can likewise be used in accordance with the present invention.

Figure 6:
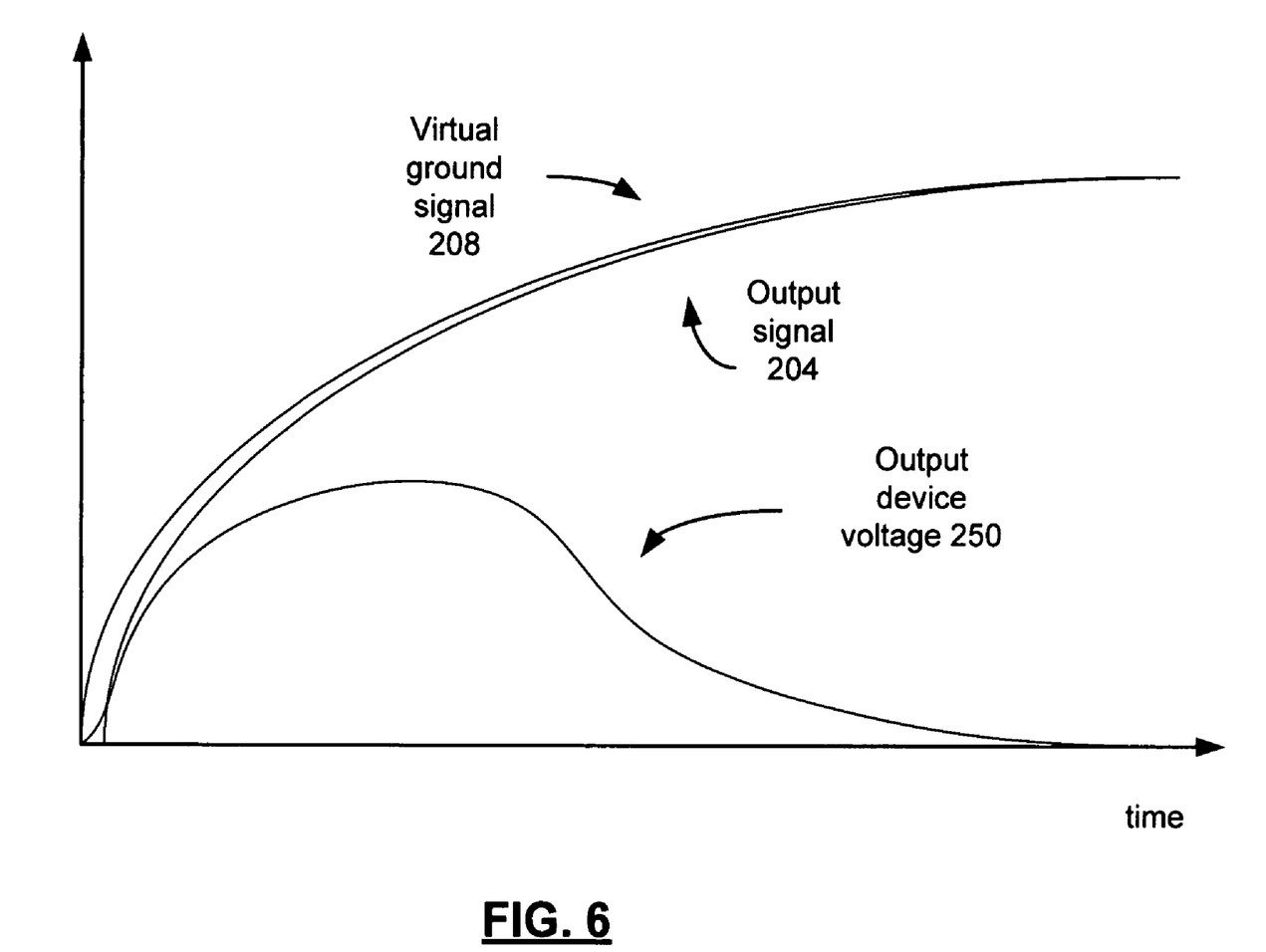
FIG. 6 presents a graphical representation of a signal diagram in accordance with an embodiment of the present invention.

FIG. 6 presents a graphical representation of a signal diagram in accordance with an embodiment of the present invention. In particular, a timing diagram is presented the describes the operation of the embodiment of FIG. 5 during power-up. During power-up of audio output driver 150 (or 151) amplified signal 201 is disabled until virtual ground reference 212 has been established. Voltage equalizer 214 is not conducting because the supply voltage 216 is present. Virtual ground generator 210 charges virtual ground signal 208 at a slow rate, such as a sub-audio rate. Voltage follower 244 ties virtual ground signal 208 to virtual ground reference 212 and supplies output signal 204 through resistor 248. Output signal 204 tracks virtual ground 208, minus a voltage drop that varies due to the current through resistor 248. Because output device 206 is AC coupled, the output device voltage 250 includes a sub-audio pulse, if the recharge rate is at a sub-audio level as previously discussed.

Figure 7:
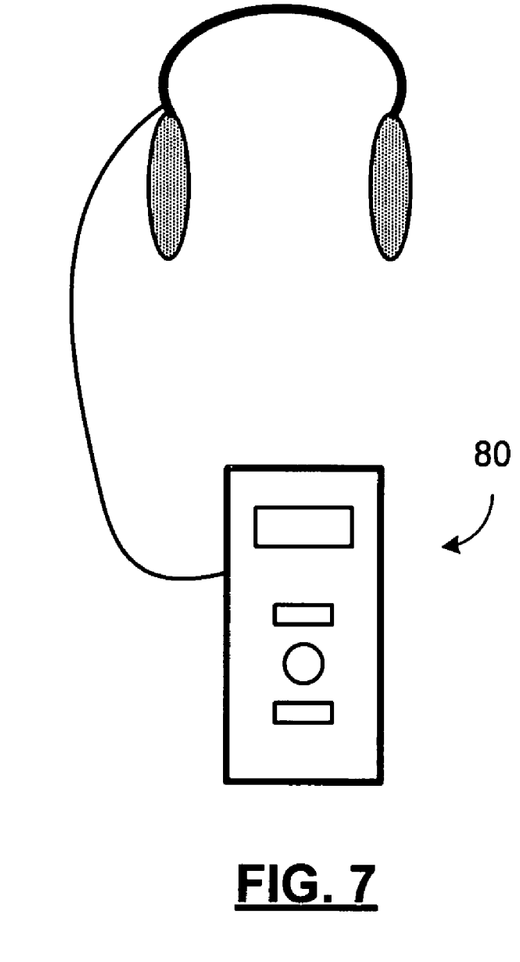
FIG. 7 presents a pictorial view of a handheld audio device in accordance with an embodiment of the present invention.

FIG. 7 presents a pictorial view of a handheld audio device in accordance with an embodiment of the present invention. While the audio output drivers 150 and 151 have been described in conjunction with their use in a computer such as computer 100, audio output drivers 150 and 151 may likewise be incorporated in a handheld audio device 80 for replaying stored audio files, as well as in voice recorders, cell-phones, and other audio devices, and other electronic devices that process audio signals to provide an audio output. In an embodiment of the present invention, one or more of the circuit modules of audio output driver 150 and/or 151 including audio amplifier 200, virtual ground generator 210, and voltage equalizer 214 are implemented as part of an integrated circuit such as a system on a chip integrated circuit.

Figure 8:
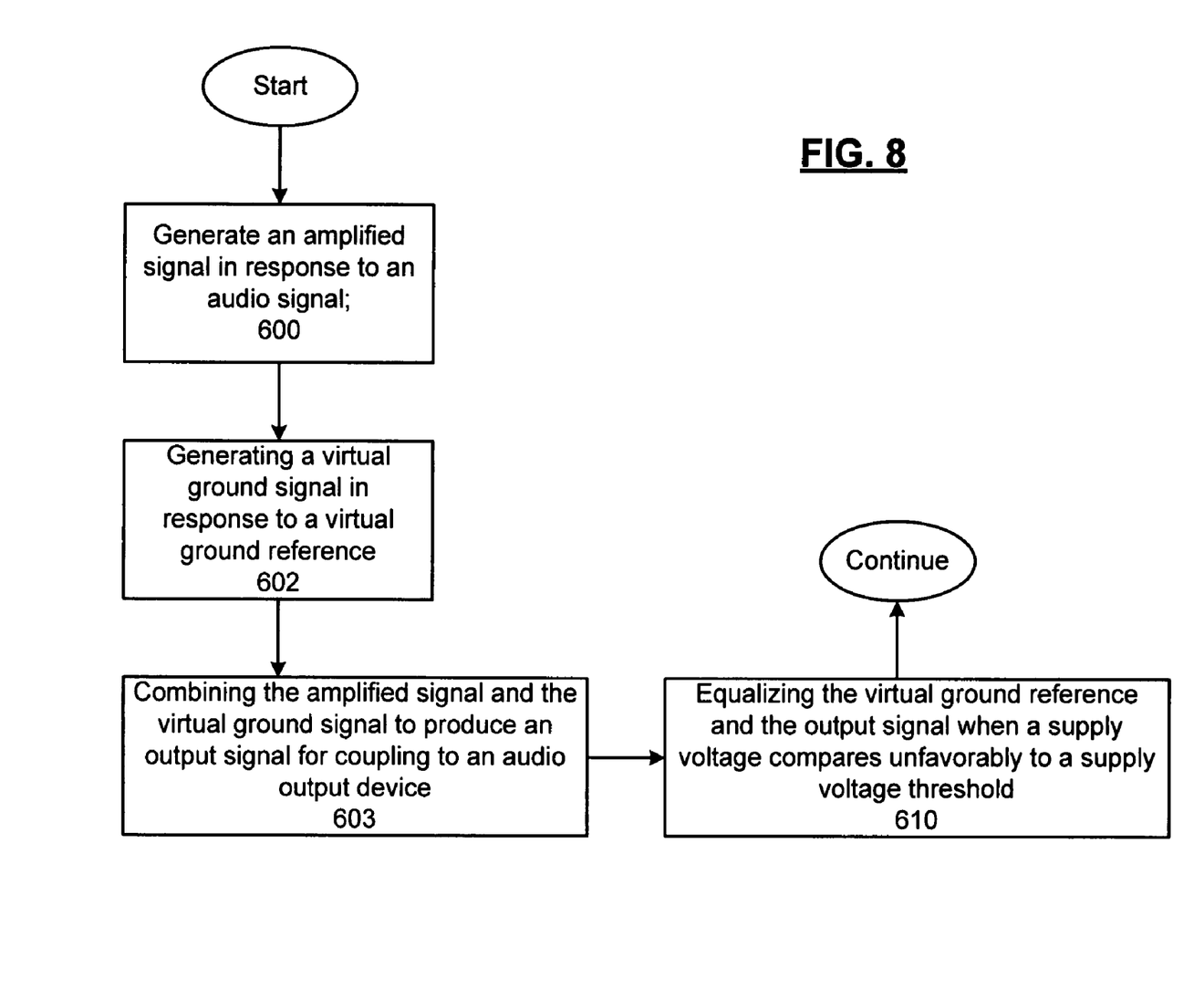
FIG. 8 presents a flowchart representation of a method in accordance with the present invention.

FIG. 8 presents a flowchart representation of a method in accordance with the present invention. In particular, a method is presented for use in conjunction with one or more of the features or functions described in association with FIGS. 1-7. In step 600 an amplified signal is generated in response to an audio signal. In step 602, a virtual ground signal is generated in response to a virtual ground reference. In step 603, the amplified signal and the virtual ground signal are combined to produce an output signal for coupling to an audio output device. In step 610, the virtual ground reference and the output signal are equalized when a supply voltage compares unfavorably to a supply voltage threshold. In an embodiment of the present invention, step 610 includes conducting a current between the virtual ground reference and the virtual ground signal when the supply voltage compares unfavorably to the supply voltage threshold.

Figure 9:
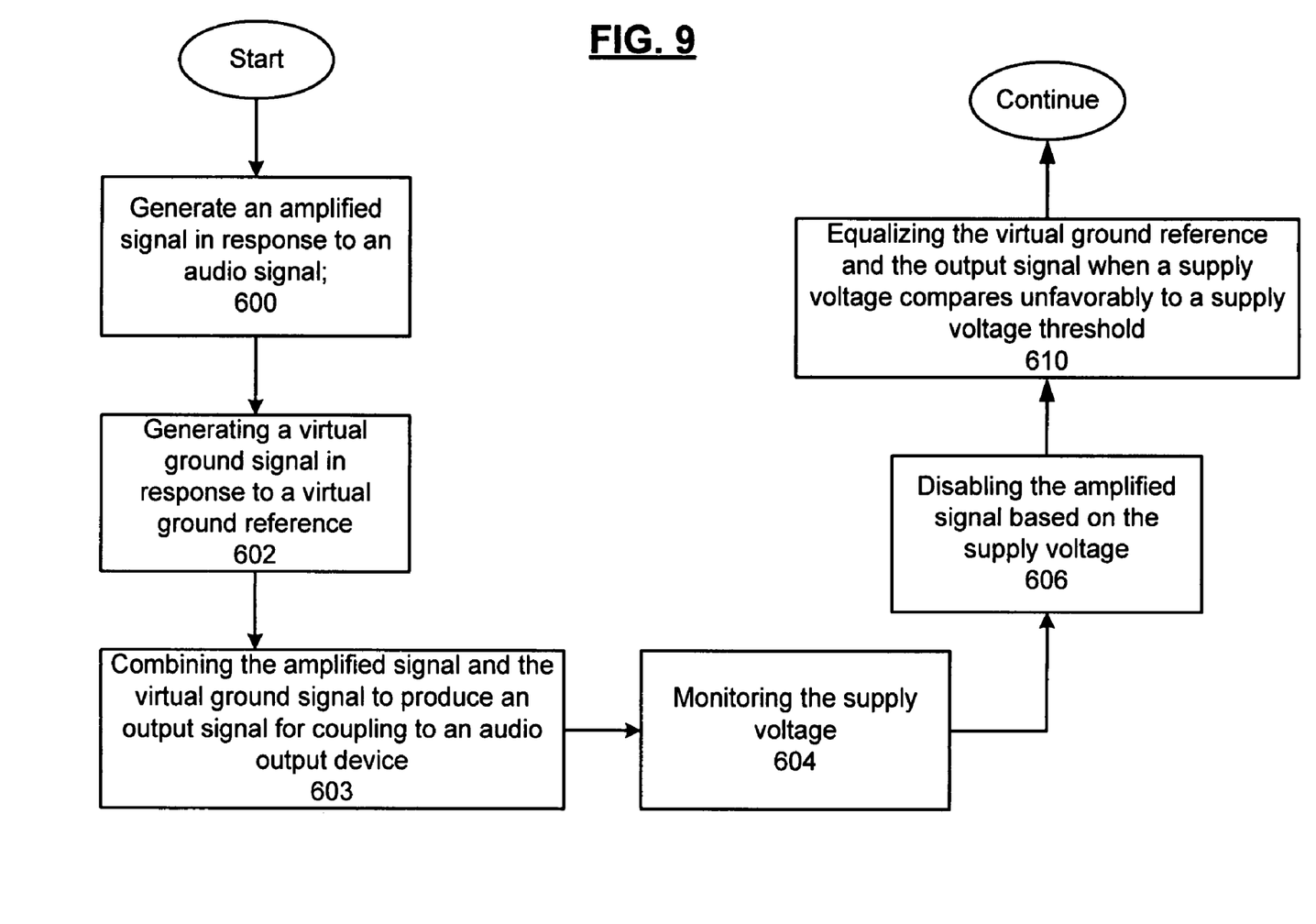
FIG. 9 presents a flowchart representation of a method in accordance with the present invention.

FIG. 9 presents a flowchart representation of a method in accordance with the present invention. In particular, a method is presented for use in conjunction with one or more of the features or functions described in association with FIGS. 1-8. This method includes steps 600, 602, 603, and 610 as described in association with FIG. 8. Further, the method includes step 604 for monitoring the supply voltage. In step 606, the method continues by disabling the amplified signal, based on the supply voltage.

Figure 10:
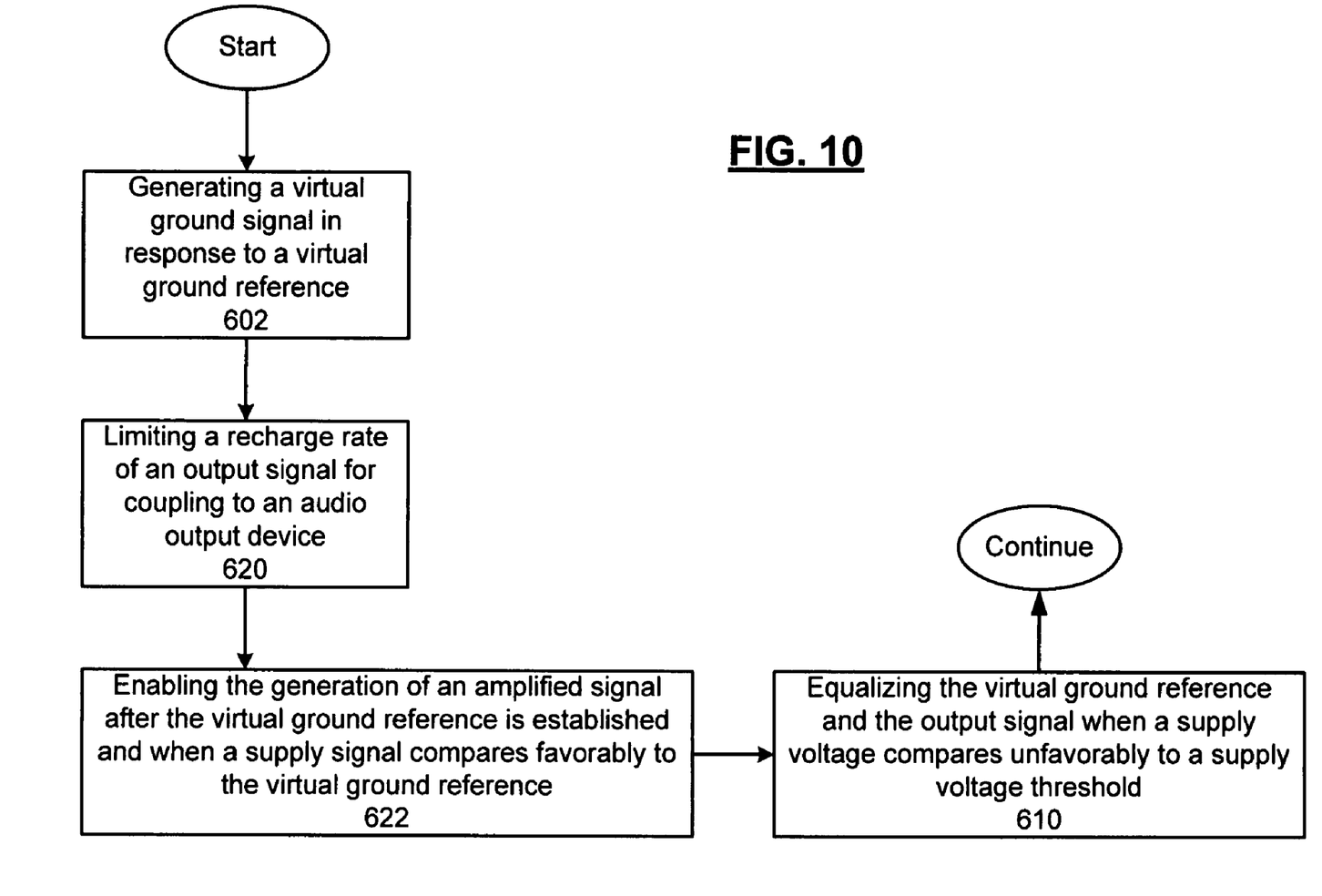
FIG. 10 presents a flowchart representation of a method in accordance with the present invention.

FIG. 10 presents a flowchart representation of a method in accordance with the present invention. In particular, a method is presented for use in conjunction with one or more of the features or functions described in association with FIGS. 1-9. This method includes steps 602 and 610 as described in association with FIG. 8. In addition, the method includes step 620 for limiting a recharge rate of the output signal during a power-up procedure. In step 622, the amplified signal is enabled, after the virtual ground reference is established and when the supply signal compares favorably to the virtual ground reference.

Figure 11:
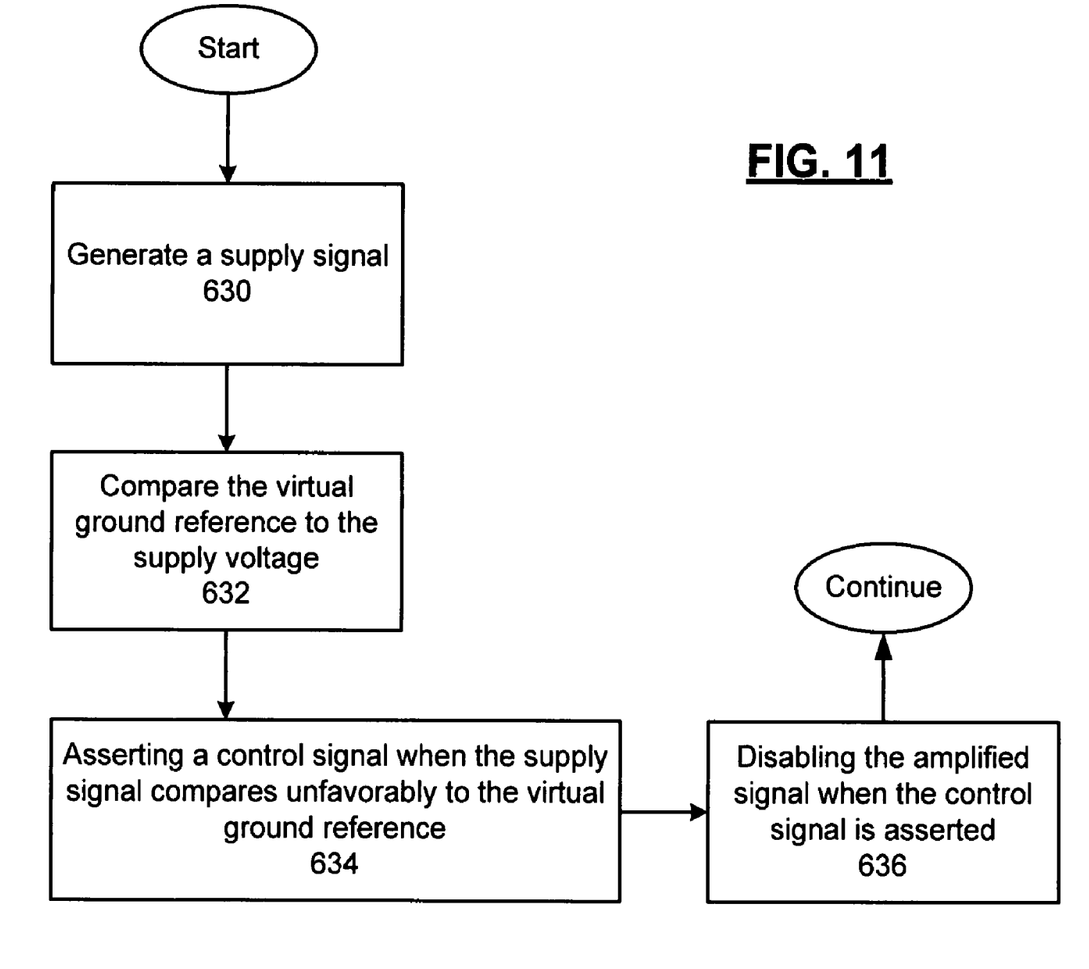
FIG. 11 presents a flowchart representation of a method in accordance with the present invention.

FIG. 11 presents a flowchart representation of a method in accordance with the present invention. A method is presented for use in conjunction with one or more of the features or functions described in association with FIGS. 1-10. In particular, a method is presented for inclusion in step 606 of FIG. 9. In step 630, a supply signal is generated. In step 632, the virtual ground reference is compared to the supply signal. In step 634 a control signal is asserted when the supply signal compares unfavorably to the virtual ground reference. In step 636 the amplified signal is disabled when the control signal is asserted.

The various modules disclosed herein can be implemented using hardware or using a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions that are stored in memory. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that, the memory stores, and the processing module executes, operational instructions corresponding to at least some of the steps and/or functions illustrated herein.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

In preferred embodiments, the various circuit components are implemented using 0.35 micron or smaller CMOS technology. Provided however that other circuit technologies including other transistor, diode and resistive logic, both integrated or non-integrated, may be used within the broad scope of the present invention. Likewise, various embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing an audio output driver that can be implemented on an integrated circuit such as a system on a chip integrated circuit. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. An audio output driver comprising:
an audio amplifier for generating an amplified signal;
a virtual ground generator, operably coupled to an output device, for generating a virtual ground signal in response to a virtual ground reference;
a combiner, operably coupled to the audio amplifier and to the virtual ground generator, for producing an output signal, based on the amplified signal and the virtual ground signal, that is coupled to an audio output device; and
a voltage equalizer, operably coupled to a supply voltage, the virtual ground reference and virtual ground signal, for equalizing the virtual ground reference and the output signal when the supply voltage compares unfavorably to a supply voltage threshold.

2. The audio output driver of claim 1 further comprising:
an amplifier controller for monitoring the supply voltage to the audio amplifier and for disabling the amplified signal, based on the supply voltage.

3. The audio output driver of claim 2 wherein the amplifier controller includes:
a supply signal generator, operably coupled to the supply voltage, for generating a supply signal; and
a comparator for comparing the virtual ground reference to the supply signal and for asserting a control signal when the supply signal compares unfavorably to the virtual ground reference.

4. The audio output driver of claim 3 further comprising:
a switch, operably coupled to the amplifier and the control signal, for disabling the amplified signal when the control signal is asserted.

5. The audio output driver of claim 3 wherein the amplifier controller enables the amplified signal, after the virtual ground reference is established and when the supply signal compares favorably to the virtual ground reference.

6. The audio output driver of claim 1 wherein the voltage equalizer conducts a current between the virtual ground reference and the virtual ground signal when the supply voltage compares unfavorably to the supply voltage threshold.

7. The audio output driver of claim 1 wherein the voltage equalizer includes a p-channel metal oxide semiconductor transistor.

8. The audio output driver of claim 1 further comprising:
a recharge limiter, coupled to the output signal and the voltage equalizer to limit a recharge rate of the output signal during a power-up procedure.

9. The audio output driver of claim 1 wherein the recharge rate of the output signal is limited to a sub-audio rate.

10. The audio output driver of claim 1 wherein at least one of: the audio amplifier, the virtual ground generator, and the voltage equalizer is implemented as part of a system on a chip integrated circuit.

11. A method of operating an audio output driver comprising:
generating, by an audio amplifier, an amplified signal in response to an audio signal;
generating, by a virtual ground generator, a virtual ground signal in response to a virtual ground reference;
combining, by a combiner, the amplified signal and the virtual ground signal to produce an output signal for coupling to an audio output device; and
equalizing, by a voltage equalizer, the virtual ground reference and the output signal when a supply voltage compares unfavorably to a supply voltage threshold.

12. The method of claim 11 further comprising:
monitoring, by an amplifier controller, the supply voltage; and
disabling the amplified signal, by the amplifier controller, based on the supply voltage.

13. The method of claim 12 wherein the step of disabling the amplified signal by the amplifier controller includes:
generating a supply signal;
comparing the virtual ground reference to the supply signal;
asserting a control signal when the supply signal compares unfavorably to the virtual ground reference; and
disabling the amplified signal when the control signal is asserted.

14. The method of claim 13 further comprising:
enabling the amplified signal, by the amplifier controller, after the virtual ground reference is established and when the supply signal compares favorably to the virtual ground reference.

15. The method of claim 11 wherein the step of equalizing the virtual ground reference and the output signal by the voltage equalizer includes:
conducting a current between the virtual ground reference and the virtual ground signal when the supply voltage compares unfavorably to the supply voltage threshold.

16. The method of claim 11 further comprising:
limiting, by a recharge limiter, a recharge rate of the output signal during a power-up procedure.

17. The method of claim 16 wherein the step of limiting the recharge rate of the output signal by the recharge limiter includes limiting the recharge rate to a sub-audio rate.

18. A method of operating an audio output driver comprising:
generating, by a virtual ground generator, a virtual ground signal in response to a virtual ground reference during a power-up procedure;
limiting, by a recharge limiter, a recharge rate of an output signal for coupling to an audio output device;
enabling, by an amplifier controller, the generation of an amplified signal after the virtual ground reference is established and when a supply signal compares favorably to the virtual ground reference; and
equalizing, by a voltage equalizer, the virtual ground reference and the output signal when a supply voltage compares unfavorably to a supply voltage threshold.

19. The method of claim 18 wherein the step of limiting the recharge rate of the output signal by the recharge limiter includes limiting the recharge rate to a sub-audio rate.

20. A method of operating an audio output driver comprising:
generating, by an audio amplifier, an amplified signal in response to an audio signal;
generating, by a virtual ground generator, a virtual ground signal in response to a virtual ground reference;
combining, by a combiner, the amplified signal and the virtual ground signal to producing an output signal for coupling to an audio output device;
monitoring, by an amplifier controller, a supply voltage;
disabling the amplified signal by the amplifier controller, based on the supply voltage; and
equalizing, by a voltage equalizer, the virtual ground reference and the output signal when the amplified signal is disabled.

21. The method of claim 20 wherein the step of disabling the amplified signal by the amplifier controller includes:
generating a supply signal;

comparing the virtual ground reference to the supply signal;

asserting a control signal when the supply signal compares unfavorably to the virtual ground reference; and disabling the amplified signal when the control signal is asserted.

22. The method of claim 20 wherein the step of equalizing the virtual ground reference and the output signal by the voltage equalizer includes:

conducting a current between the virtual ground reference and the virtual ground signal when the supply voltage compares unfavorably to a supply voltage threshold.

* * * * *